US012813139B2

(12) United States Patent
Yanagisawa et al.

(10) Patent No.: US 12,813,139 B2
(45) Date of Patent: Nov. 24, 2026

(54) DISPLAY DEVICE

(71) Applicant: Magnolia White Corporation, Tokyo (JP)

(72) Inventors: Sho Yanagisawa, Tokyo (JP); Hideyuki Takahashi, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 300 days.

(21) Appl. No.: 18/769,470

(22) Filed: Jul. 11, 2024

(65) Prior Publication Data

US 2025/0057014 A1 Feb. 13, 2025

(30) Foreign Application Priority Data

Aug. 9, 2023 (JP) ................................ 2023-130151

(51) Int. Cl.
*H10K 59/122* (2023.01)
*H10K 59/80* (2023.01)

(52) U.S. Cl.
CPC ......... *H10K 59/873* (2023.02); *H10K 59/122* (2023.02)

(58) Field of Classification Search
CPC .... H10K 59/873; H10K 59/80; H10K 59/122; H10K 59/8731; H10K 59/121
See application file for complete search history.

(56) References Cited

U.S. PATENT DOCUMENTS

| | | | | |
|---|---|---|---|---|
| 2004/0160170 | A1 | 8/2004 | Sato et al. | |
| 2009/0009069 | A1 | 1/2009 | Takata | |
| 2019/0363275 | A1 | 11/2019 | Ochi et al. | |
| 2021/0111374 | A1 * | 4/2021 | Sung | G06F 3/0412 |
| 2022/0077251 | A1 | 3/2022 | Choung et al. | |
| 2022/0102678 | A1 * | 3/2022 | Kim | H10K 50/11 |
| 2022/0173187 | A1 * | 6/2022 | Seon | H10K 59/122 |

FOREIGN PATENT DOCUMENTS

| | | | |
|---|---|---|---|
| JP | 2000-195677 | A | 7/2000 |
| JP | 2004-207217 | A | 7/2004 |
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

*Primary Examiner* — Nikolay K Yushin
(74) *Attorney, Agent, or Firm* — XSENSUS LLP

(57) ABSTRACT

According to one embodiment, a display device includes a substrate having a display area and a surrounding area, a plurality of display elements each of which includes a lower electrode, an upper electrode and an organic layer, a first partition provided between the adjacent display elements, a first dam portion which protrudes to an upper side of the substrate and surrounds the display area, and a second partition which overlaps at least part of the first dam portion. Further, each of the first and second partitions includes a conductive lower portion and an upper portion having an end portion protruding from a side surface of the lower portion.

20 Claims, 9 Drawing Sheets

DISPLAY DEVICE

CROSS-REFERENCE TO RELATED APPLICATION

This application is based upon and claims the benefit of priority from Japanese Patent Application No. 2023-130151, filed Aug. 9, 2023, the entire contents of which are incorporated herein by reference.

FIELD

Embodiments described herein relate generally to a display device.

BACKGROUND

Recently, display devices to which an organic light emitting diode (OLED) is applied as a display element have been put into practical use. In this type of display devices, a technique which can improve the yield and reliability is required.

DETAILED DESCRIPTION

Figure 1:
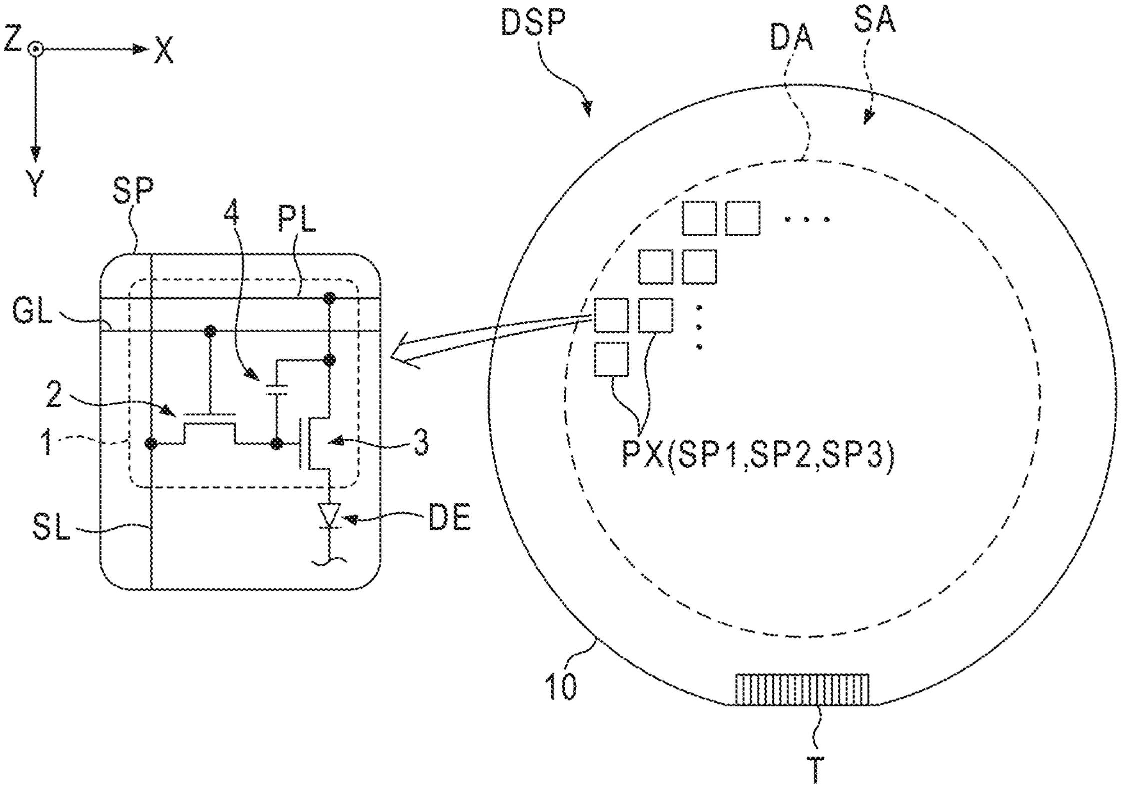
FIG. 1 is a diagram showing a configuration example of a display device according to an embodiment.

In general, according to one embodiment, a display device comprises a substrate having a display area which displays an image and a surrounding area around the display area, a plurality of display elements each of which includes a lower electrode, an upper electrode located above the lower electrode and an organic layer located between the lower electrode and the upper electrode and emitting light based on application of voltage, and is provided in the display area, a first partition provided in the display area and provided between the adjacent display elements, a first dam portion which is provided in the surrounding area, protrudes to an upper side of the substrate and surrounds the display area, and a second partition which overlaps at least part of the first dam portion as seen in plan view. Further, each of the first partition and the second partition includes a conductive lower portion and an upper portion having an end portion protruding from a side surface of the lower portion.

The embodiments can provide a display device which can realize the improvement of the yield or reliability.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as an X-direction. A direction parallel to the Y-axis is referred to as a Y-direction. A direction parallel to the Z-axis is referred to as a Z-direction. The Z-direction is the normal direction of a plane including the X-direction and the Y-direction. When various elements are viewed parallel to the Z-direction, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

FIG. 1 is a diagram showing a configuration example of a display device DSP according to an embodiment. The display device DSP comprises an insulating substrate 10. The substrate 10 has a display area DA which displays an image, and a surrounding area SA around the display area DA. The substrate 10 may be glass or a resinous film having flexibility.

In the embodiment, the substrate 10 and the display area DA are circular as seen in plan view. It should be noted that the shape of each of the substrate 10 and the display area DA in plan view is not limited to a circle and may be another shape such as a rectangle, a square or an oval.

The display area DA comprises a plurality of pixels PX arrayed in matrix in an X-direction and a Y-direction. Each pixel PX includes a plurality of subpixels SP which display different colors. This embodiment assumes a case where each pixel PX includes a blue subpixel SP1, a green subpixel SP2 and a red subpixel SP3. However, each pixel PX may include a subpixel SP which exhibits another color such as white in addition to subpixels SP1, SP2 and SP3 or instead of one of subpixels SP1, SP2 and SP3.

The display device DSP further comprises a terminal portion T provided in the surrounding area SA. For example, a flexible printed circuit which applies voltage and signals for driving the display device DSP is connected to the terminal portion T.

Each subpixel SP comprises a pixel circuit 1 and a display element DE driven by the pixel circuit 1. The pixel circuit 1 comprises a pixel switch 2, a drive transistor 3 and a capacitor 4. Each of the pixel switch 2 and the drive transistor 3 is, for example, a switching element consisting of a thin-film transistor.

A plurality of scanning lines GL which supply a scanning signal to the pixel circuit 1 of each subpixel SP, a plurality of signal lines SL which supply a video signal to the pixel circuit 1 of each subpixel SP and a plurality of power lines PL are provided in the display area DA. In the example of FIG. 1, the scanning lines GL and the power lines PL extend in the X-direction, and the signal lines SL extend in the Y-direction.

The gate electrode of the pixel switch 2 is connected to the scanning line GL. One of the source electrode and drain electrode of the pixel switch 2 is connected to the signal line SL. The other one is connected to the gate electrode of the drive transistor 3 and the capacitor 4. In the drive transistor 3, one of the source electrode and the drain electrode is connected to the power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
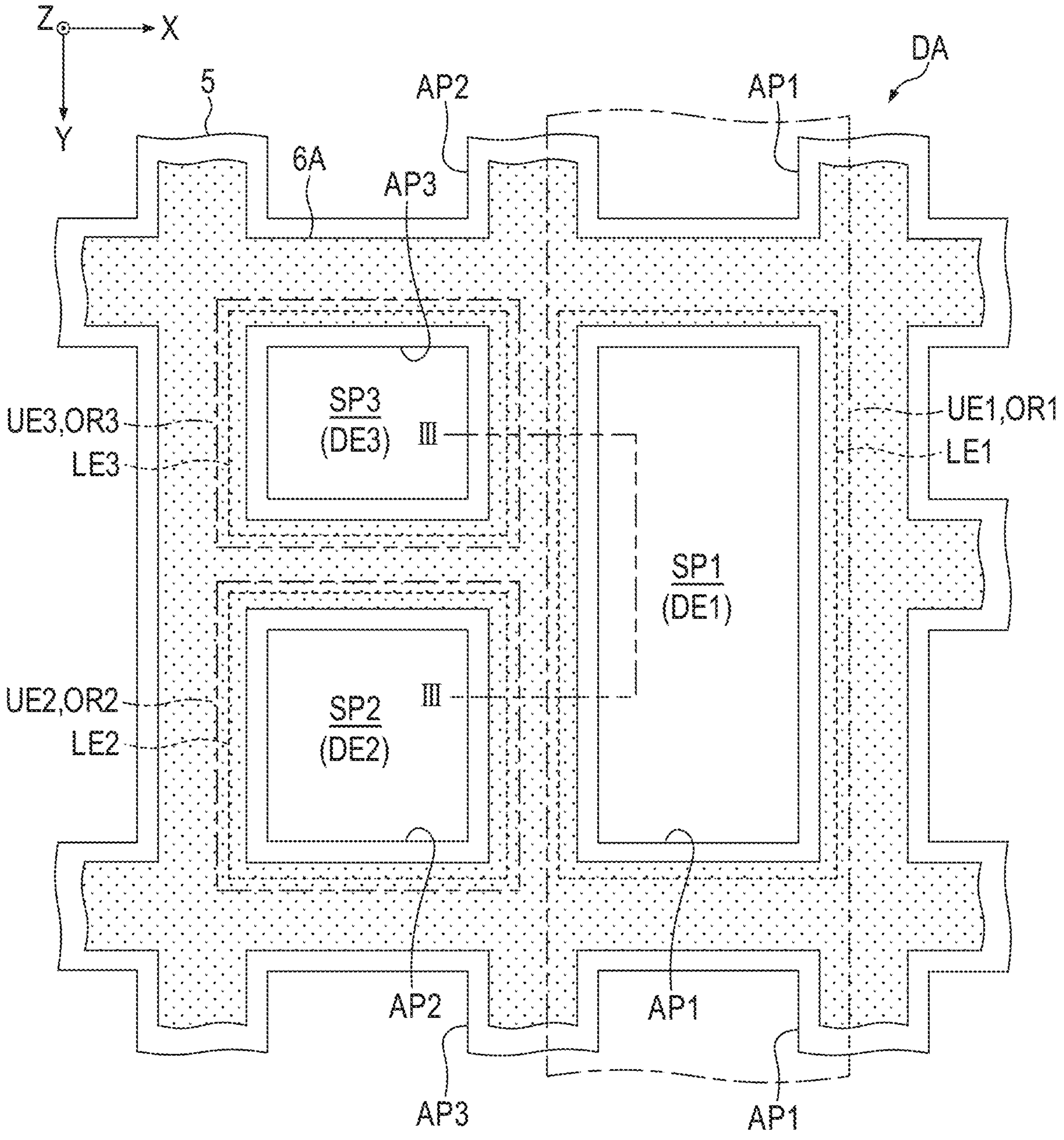
FIG. 2 is a schematic plan view showing an example of the layout of subpixels.

FIG. 2 is a schematic plan view showing an example of the layout of subpixels SP1, SP2 and SP3. In the example of FIG. 2, each of subpixels SP2 and SP3 is adjacent to subpixel SP1 in the X-direction. Further, subpixels SP2 and SP3 are arranged in the Y-direction.

When subpixels SP1, SP2 and SP3 are provided in line with this layout, a column in which subpixels SP2 and SP3 are alternately provided in the Y-direction and a column in which a plurality of subpixels SP1 are repeatedly provided in the Y-direction are formed in the display area DA. These columns are alternately arranged in the X-direction. It should be noted that the layout of subpixels SP1, SP2 and SP3 is not limited to the example of FIG. 2.

A rib 5 is provided in the display area DA. The rib 5 comprises pixel apertures AP1, AP2 and AP3 in subpixels SP1, SP2 and SP3, respectively. In the example of FIG. 2, the pixel aperture AP1 is larger than the pixel aperture AP2. The pixel aperture AP2 is larger than the pixel aperture AP3. Thus, among subpixels SP1, SP2 and SP3, the aperture ratio of subpixel SP1 is the greatest, and the aperture ratio of subpixel SP3 is the least.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

Of the lower electrode LE1, the upper electrode UE1 and the organic layer OR1, the portions which overlap the pixel aperture AP1 constitute the display element DE1 of subpixel SP1. Of the lower electrode LE2, the upper electrode UE2 and the organic layer OR2, the portions which overlap the pixel aperture AP2 constitute the display element DE2 of subpixel SP2. Of the lower electrode LE3, the upper electrode UE3 and the organic layer OR3, the portions which overlap the pixel aperture AP3 constitute the display element DE3 of subpixel SP3. Each of the display elements DE1, DE2 and DE3 may further include a cap layer as described later. The rib 5 surrounds each of these display elements DE1, DE2 and DE3.

A conductive partition 6A (first partition) is provided on the rib 5. The partition 6A overlaps the rib 5 as a whole and has the same planar shape as the rib 5. In other words, the partition 6A comprises an aperture in each of subpixels SP1, SP2 and SP3. From another viewpoint, each of the rib 5 and the partition 6A has a grating shape as seen in plan view and surrounds each of subpixels SP1, SP2 and SP3. The partition 6A functions as lines which apply common voltage to the upper electrodes UE1, UE2 and UE3.

Figure 3:
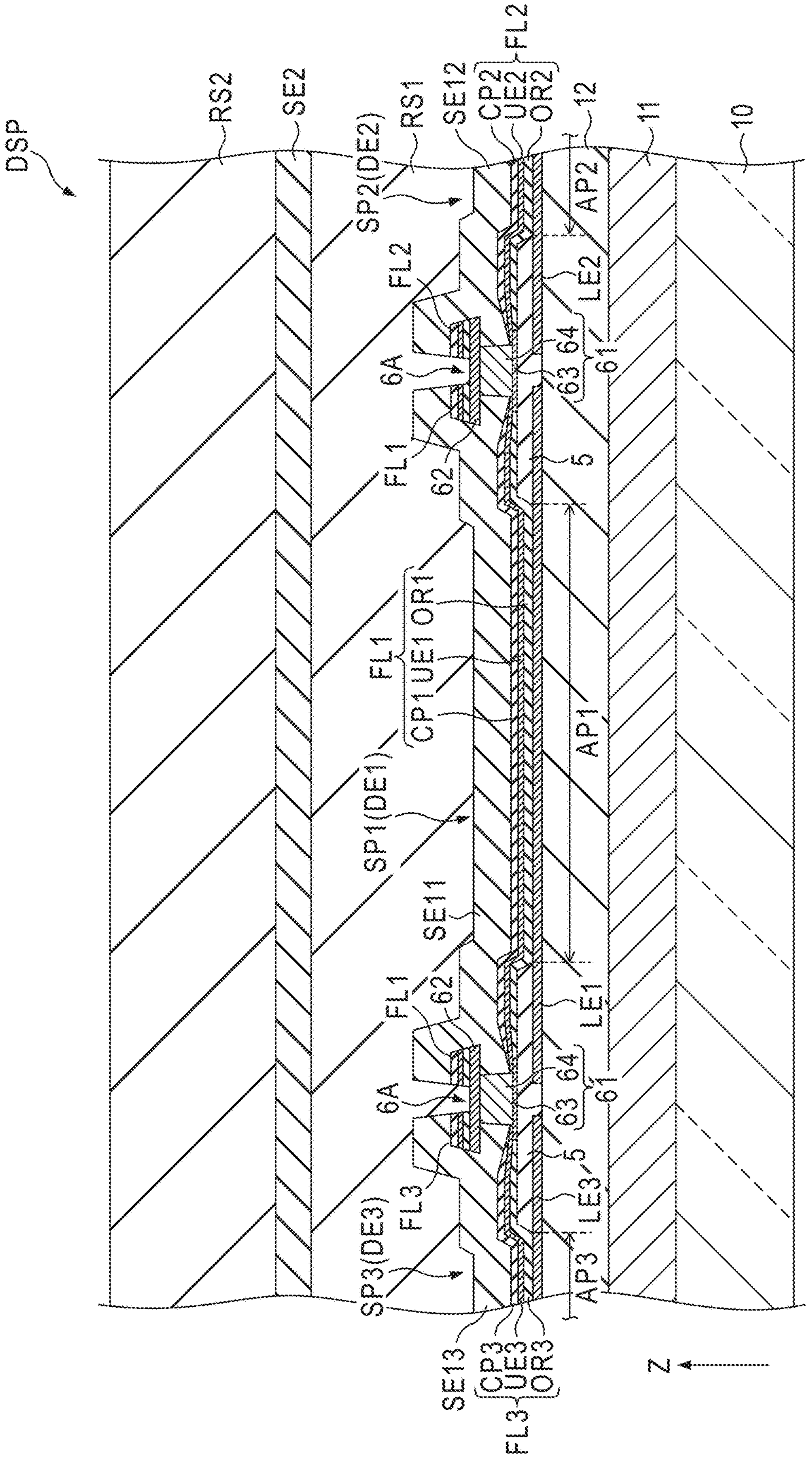
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an organic insulating layer 12. The organic insulating layer 12 functions as a planarization film which planarizes the irregularities formed by the circuit layer 11.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5. Although not shown in the section of FIG. 3, the lower electrodes LE1, LE2 and LE3 are connected to the respective pixel circuits 1 of the circuit layer 11 through respective contact holes provided in the organic insulating layer 12.

The partition 6A includes a conductive lower portion 61 provided on the rib 5 and an upper portion 62 provided on the lower portion 61. The upper portion 62 has a width greater than that of the lower portion 61. By this configuration, the both end portions of the upper portion 62 protrude relative to the side surfaces of the lower portion 61. This shape of the partition 6A is called an overhang shape.

In the example of FIG. 3, the lower portion 61 has a bottom layer 63 provided on the rib 5, and a stem layer 64 provided on the bottom layer 63. For example, the bottom layer 63 is formed so as to be thinner than the stem layer 64. In the example of FIG. 3, the both end portions of the bottom layer 63 protrude from the side surfaces of the stem layer 64.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. The upper electrodes UE1, UE2 and UE3 are in contact with the side surfaces of the lower portions 61 of the partition 6A.

The display element DE1 includes a cap layer CP1 provided on the upper electrode UE1. The display element DE2 includes a cap layer CP2 provided on the upper electrode UE2. The display element DE3 includes a cap layer CP3 provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a multilayer body including the organic layer OR1, the upper electrode UE1 and the cap layer CP1 is called a stacked film FL1. A multilayer body including the organic layer OR2, the upper electrode UE2 and the cap layer CP2 is called a stacked film FL2. A multilayer body including the organic layer OR3, the upper electrode UE3 and the cap layer CP3 is called a stacked film FL3.

The stacked film FL1 is partly located on the upper portion 62. This portion is spaced apart from, of the stacked film FL1, the portion located around the partition 6A (in other words, the portion which constitutes the display element DE1). Similarly, the stacked film FL2 is partly located on the upper portion 62. This portion is spaced apart from, of the stacked film FL2, the portion located around the partition 6A (in other words, the portion which constitutes the display element DE2). Further, the stacked film FL3 is partly located on the upper portion 62. This portion is spaced apart from, of the stacked film FL3, the portion located around the partition 6A (in other words, the portion which constitutes the display element DE3).

Sealing layers SE11, SE12 and SE13 are provided in subpixels SP1, SP2 and SP3, respectively. The sealing layer SE11 continuously covers the cap layer CP1 and the partition 6A around subpixel SP1. The sealing layer SE12 continuously covers the cap layer CP2 and the partition 6A around subpixel SP2. The sealing layer SE13 continuously covers the cap layer CP3 and the partition 6A around subpixel SP3.

In the example of FIG. 3, the stacked film FL1 and sealing layer SE11 located on the partition 6A between subpixels SP1 and SP2 are spaced apart from the stacked film FL2 and sealing layer SE12 located on this partition 6A. The stacked film FL1 and sealing layer SE11 located on the partition 6A between subpixels SP1 and SP3 are spaced apart from the stacked film FL3 and sealing layer SE13 located on this partition 6A.

The sealing layers SE11, SE12 and SE13 (first sealing layers) are covered with a resin layer RS1 (first resin layer). The resin layer RS1 is covered with a sealing layer SE2 (second sealing layer). The sealing layer SE2 is covered with a resin layer RS2 (second resin layer). The resin layers RS1 and RS2 and the sealing layer SE2 are continuously provided in at least the entire display area DA and partly extend in the surrounding area SA as well.

A cover member such as a polarizer, a touch panel, a protective film or a cover glass may be further provided above the resin layer RS2. This cover member may be attached to the resin layer RS2 via, for example, an adhesive layer such as an optical clear adhesive (OCA).

The organic insulating layer 12 is formed of an organic insulating material such as polyimide. Each of the rib 5 and the sealing layers SE11, SE12, SE13 and SE2 is formed of an inorganic insulating material such as silicon nitride (SiNx), silicon oxide (SiOx), silicon oxynitride (SiON) or aluminum oxide ($Al_2O_3$). For example, the rib 5 is formed of silicon oxynitride, and each of the sealing layers SE11, SE12, SE13 and SE2 is formed of silicon nitride. Each of the resin layers RS1 and RS2 is formed of, for example, a resinous material (organic insulating material) such as epoxy resin or acrylic resin.

Each of the lower electrodes LE1, LE2 and LE3 has a reflective layer formed of, for example, silver, and a pair of conductive oxide layers covering the upper and lower surfaces of the reflective layer. Each conductive oxide layer can be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

Each of the organic layers OR1, OR2 and OR3 consists of a plurality of thin films including a light emitting layer. For example, each of the organic layers OR1, OR2 and OR3 comprises a structure in which a hole injection layer, a hole transport layer, an electron blocking layer, a light emitting layer, a hole blocking layer, an electron transport layer and an electron injection layer are stacked in order in a Z-direction. It should be noted that each of the organic layers OR1, OR2 and OR3 may comprise another structure such as a tandem structure including a plurality of light emitting layers.

Each of the cap layers CP1, CP2 and CP3 comprises, for example, a multilayer structure in which a plurality of transparent layers are stacked. These transparent layers could include a layer formed of an inorganic material and a layer formed of an organic material. The transparent layers have refractive indices different from each other. For example, the refractive indices of these transparent layers are different from the refractive indices of the upper electrodes UE1, UE2 and UE3 and the refractive indices of the sealing layers SE11, SE12 and SE13. It should be noted that at least one of the cap layers CP1, CP2 and CP3 may be omitted.

Each of the bottom layer 63 and stem layer 64 of the partition 6A is formed of a metal material. For the metal material of the bottom layer 63, for example, molybdenum, titanium, titanium nitride (TiN), a molybdenum-tungsten alloy (MoW) or a molybdenum-niobium alloy (MoNb) can be used. For the metal material of the stem layer 64, for example, aluminum, an aluminum-neodymium alloy (AlNd), an aluminum-yttrium alloy (AlY) or an aluminum-silicon alloy (AlSi) can be used. It should be noted that the stem layer 64 may be formed of an insulating material.

For example, the upper portion 62 of the partition 6A comprises a multilayer structure consisting of a lower layer formed of a metal material and an upper layer formed of conductive oxide. For the metal material forming the lower layer, for example, titanium, titanium nitride, molybdenum, tungsten, a molybdenum-tungsten alloy or a molybdenum-niobium alloy can be used. For the conductive oxide forming the upper layer, for example, ITO or IZO can be used. It should be noted that the upper portion 62 may comprise a single-layer structure of a metal material. The upper portion 62 may further include a layer formed of an insulating material.

Common voltage is applied to the partition 6A. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively, based on the video signals of the signal lines SL.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

Figure 4:
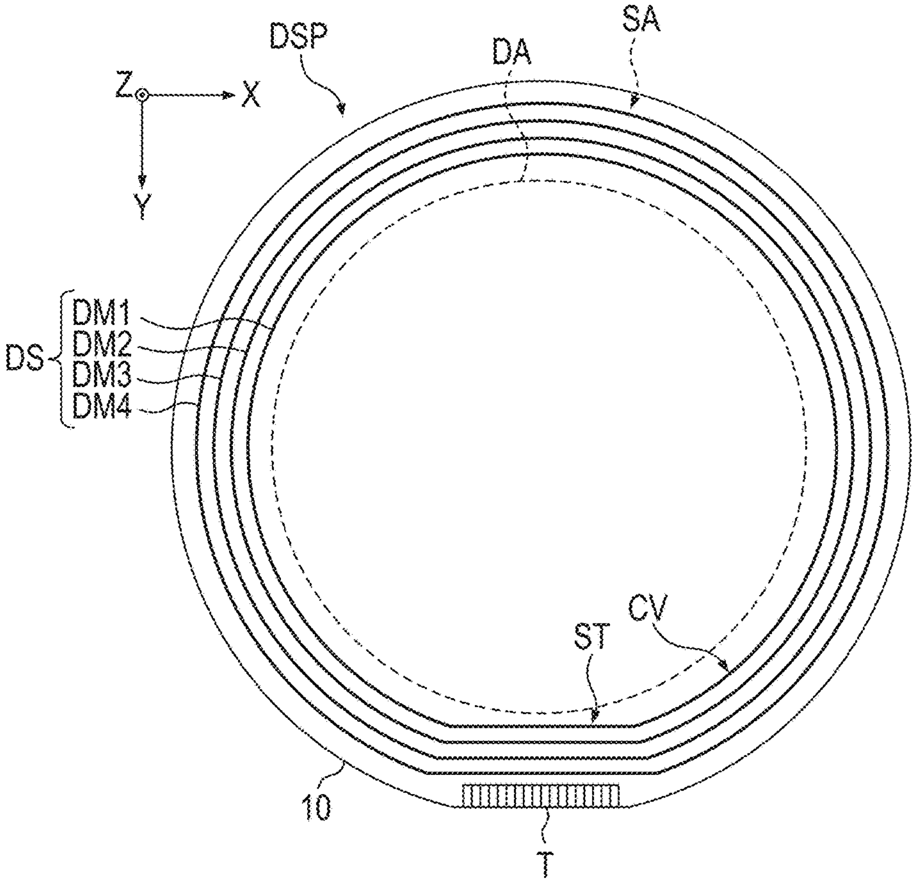
FIG. 4 is a schematic plan view of the display device for explaining the structure of a surrounding area.

FIG. 4 is a schematic plan view of the display device DSP for explaining the structure of the surrounding area SA. The display device DSP comprises a dam structure DS provided in the surrounding area SA. In the example of FIG. 4, the dam structure DS includes annular dam portions DM1, DM2, DM3 and DM4.

The dam portion DM1 surrounds the display area DA. The dam portion DM2 surrounds the dam portion DM1. The dam portion DM3 surrounds the dam portion DM2. The dam portion DM4 surrounds the dam portion DM3.

Each of the dam portions DM1, DM2, DM3 and DM4 has an arcuate curved portion CV and a linear portion ST connected to the both end portions of the curved portion CV. The curved portions CV are concentric with, for example, the display area DA. For example, the linear portions ST are located between the display area DA and the terminal portion T and extend parallel to the X-direction.

It should be noted that the shape of the dam portion DM1, DM2, DM3 or DM4 is not limited to the example of FIG. 4. Further, the number of dam portions provided in the dam structure DS may be three or less or may be five or more.

Figure 5:
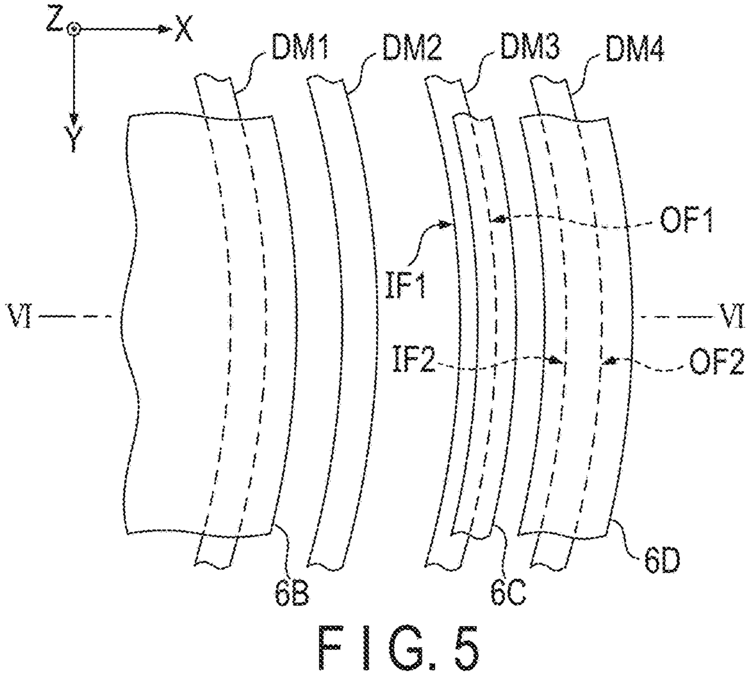
FIG. 5 is an enlarged plan view of part of the surrounding area.

FIG. 5 is an enlarged plan view of part of the surrounding area SA. In addition to the dam structure DS, partitions 6B, 6C and 6D are provided in the surrounding area SA. The partition 6B overlaps at least part of the dam portion DM1 as seen in plan view. The partition 6C overlaps at least part of the dam portion DM3 as seen in plan view. The partition 6D overlaps at least part of the dam portion DM4 as seen in plan view. The dam portions DM3 and DM4 are examples of first and second dam portions, respectively. The partitions 6C and 6D are examples of second and third partitions, respectively.

The partitions 6B, 6C and 6D are formed by the same process as the partition 6A shown in FIG. 2 and FIG. 3 and have structures similar to the structure of the partition 6A. Specifically, each of the partitions 6B, 6C and 6D has a lower portion 61 and an upper portion 62. Further, the lower portion 61 of each of the partitions 6B, 6C and 6D has a bottom layer 63 and a stem layer 64.

For example, the partitions 6B, 6C and 6D surround the display area DA together with the dam portions DM1, DM2, DM3 and DM4. The width of the partition 6B is greater than the widths of the partitions 6C and 6D. The partition 6B is connected to the partition 6A described above. In other words, common voltage is applied to the partition 6B.

Both the partition 6C and the partition 6D are spaced apart from the partition 6B. The dam portion DM2 is interposed between the partition 6B and the partition 6C. In the example of FIG. 5, the dam portion DM2 is not covered with any of the partitions 6B, 6C and 6D.

The dam portion DM3 has an inner surface IF1 on the display area DA side (the left side in the figure) and an outer surface OF1 on a side opposite to the inner surface IF1. The dam portion DM4 has an inner surface IF2 on the display area DA side and an outer surface OF2 on a side opposite to the inner surface IF2.

In the example of FIG. 5, the partition 6C overlaps the outer surface OF1 and does not overlap the inner surface IF1. The partition 6D has a width which is greater than the width of the partition 6C, and overlaps both the inner surface IF2 and the outer surface OF2.

Figure 6:
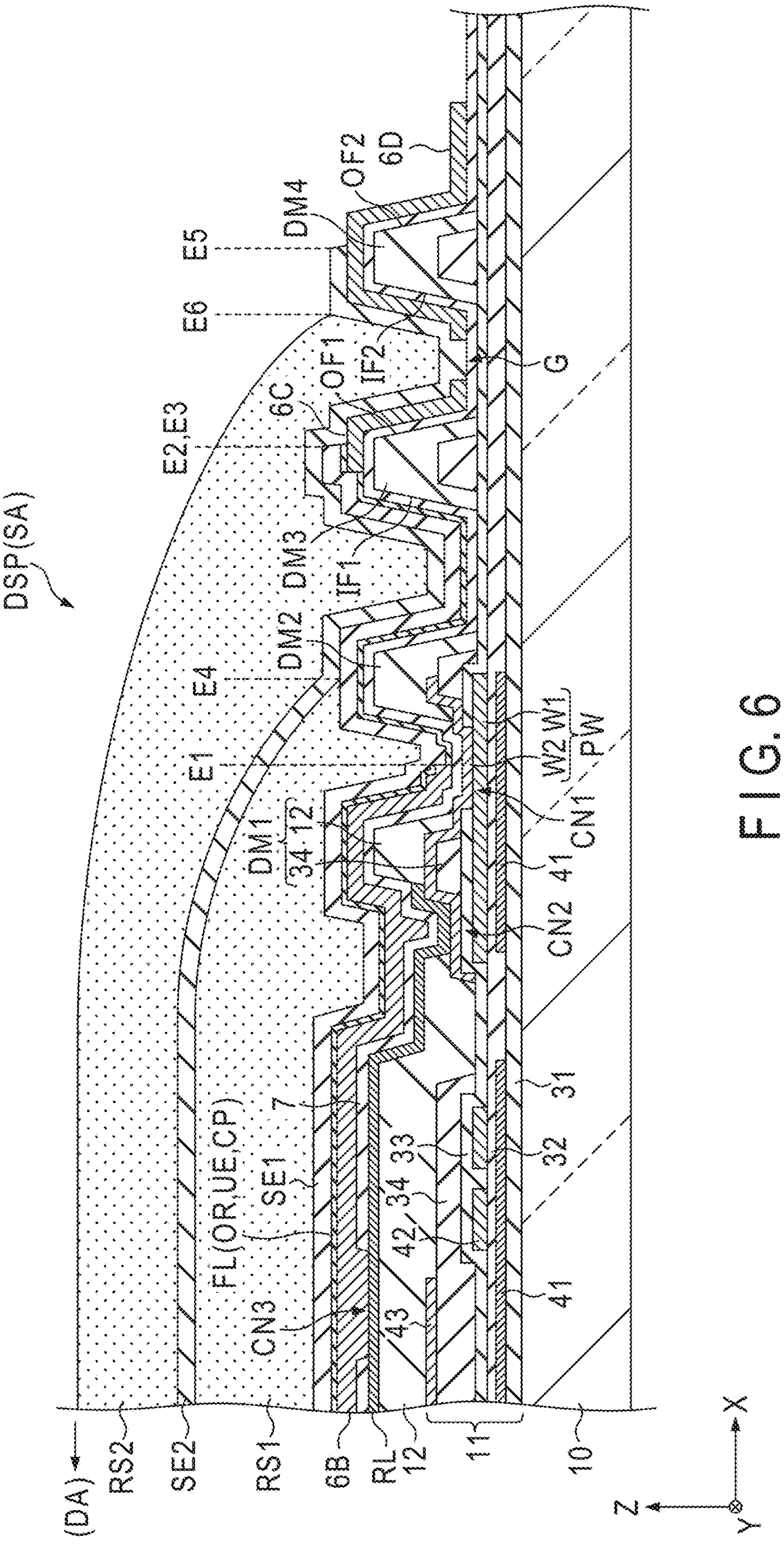
FIG. 6 is a schematic cross-sectional view of the display device along the VI-VI line of FIG. 5.
Figure 7:
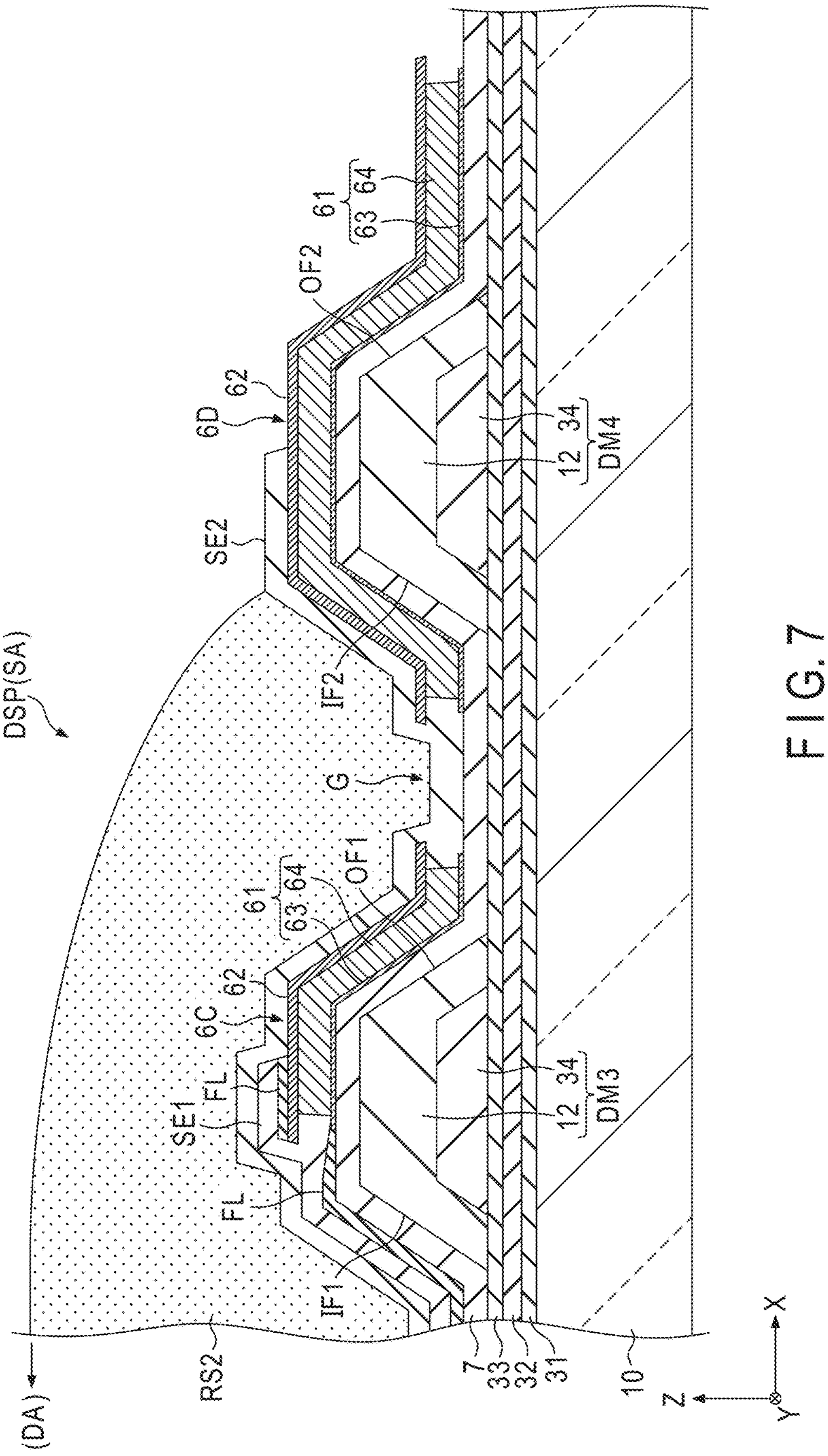
FIG. 7 is a schematic cross-sectional view in which part of FIG. 6 is enlarged.

FIG. 6 is a schematic cross-sectional view of the display device DSP along the VI-VI line of FIG. 5. FIG. 7 is a schematic cross-sectional view in which the vicinity of the dam portions DM3 and DM4 in FIG. 6 is enlarged. The circuit layer 11 shown in FIG. 3 has inorganic insulating layers 31, 32 and 33 each of which is formed of an inorganic insulating material, an organic insulating layer 34 formed of an organic insulating material, and metal layers 41, 42 and 43. The inorganic insulating layer 31 covers the upper surface of the substrate 10. The metal layer 41 is provided on the inorganic insulating layer 31. The inorganic insulating layer 32 covers the metal layer 41. The metal layer 42 is provided on the inorganic insulating layer 32. The inorganic insulating layer 33 covers the metal layer 42. The organic insulating layer 34 covers the inorganic insulating layer 33. The metal layer 43 is provided on the organic insulating layer 34 and is covered with the organic insulating layer 12.

All of the dam portions DM1, DM2, DM3 and DM4 protrude to the upper side of the substrate 10. In the example of FIG. 6, the dam portion DM1 consists of the organic insulating layers 12 and 34. Similarly, the dam portions DM2, DM3 and DM4 consist of the organic insulating layers 12 and 34. Thus, in the embodiment, the dam portions DM1, DM2, DM3 and DM4 are mainly formed of organic insulating materials.

The power line PW to which common voltage is applied is provided under the dam portions DM1 and DM2. The power line PW has a first line W1 formed of the metal layer 42, and a second line W2 formed of the metal layer 43.

In the example of FIG. 6, the first line W1 and the second line W2 are in contact with each other in a contact portion CN1 located between the dam portions DM1 and DM2. The second line W2 is partly located between the organic insulating layers 12 and 34 in each of the dam portions DM1 and DM2.

A conductive relay layer RL and an inorganic insulating layer 7 are further provided in the surrounding area SA. For example, the relay layer RL is formed of the same material by the same process as the lower electrodes LE1, LE2 and LE3 described above. For example, the inorganic insulating layer 7 is formed of the same inorganic insulating material by the same process as the rib 5 described above.

The relay layer RL is located on the display area DA side (the left side in the figure) relative to the dam portion DM1 and covers the organic insulating layer 12. The relay layer RL is in contact with the second line W2 of the power line PW in a contact portion CN2 located near the dam portion DM1. The inorganic insulating layer 7 continuously covers the relay layer RL and the dam portions DM1, DM2, DM3 and DM4.

The partitions 6B, 6C and 6D described above are provided on the inorganic insulating layer 7. In the example of FIG. 6, the end portion E1 of the partition 6B is located between the dam portions DM1 and DM2. The partition 6B is in contact with the relay layer RL in a contact portion CN3. The inorganic insulating layer 7 is open in the contact portion CN3. For example, the contact portion CN3 is located between the contact portion CN2 and the display area DA.

An end of the partition 6C is located above the upper surface of the dam portion DM3, and the other end is located between the dam portions DM3 and DM4. Thus, the partition 6C faces the outer surface OF1 of the dam portion DM3 via the inorganic insulating layer 7 and does not face the inner surface IF1 of the dam portion DM3.

An end of the partition 6D is located between the dam portions DM3 and DM4, and the other end is located on an external side relative to the dam portion DM4. Thus, the partition 6D faces both the inner surface IF2 and the outer surface OF2 of the dam portion DM4 via the inorganic insulating layer 7.

The partition 6B is covered with a stacked film FL. The stacked film FL is covered with a sealing layer SE1. The stacked film FL includes an organic layer OR, an upper electrode UE which covers the organic layer OR, and a cap layer CP which covers the upper electrode UE. The partitions 6C and 6D are spaced apart from each other across an intervening gap G. The gap G is located in a valley portion between the dam portions DM3 and DM4.

The stacked film FL is one of the stacked films FL1, FL2 and FL3 shown in FIG. 3. The sealing layer SE1 is one of the sealing layers SE11, SE12 and SE13 shown in FIG. 3. When the stacked film FL is the stacked film FL1, the organic layer OR, the upper electrode UE and the cap layer CP correspond to the organic layer OR1, the upper electrode UE1 and the cap layer CP1, respectively. When the stacked film FL is the stacked film FL2, the organic layer OR, the upper electrode UE and the cap layer CP correspond to the organic layer OR2, the upper electrode UE2 and the cap layer CP2, respectively. When the stacked film FL is the stacked film FL3, the organic layer OR, the upper electrode UE and the cap layer CP correspond to the organic layer OR3, the upper electrode UE3 and the cap layer CP3, respectively.

When the display device DSP is manufactured, the stacked films FL1, FL2 and FL3 are formed in series by photolithographic processes. The sealing layers SE11, SE12 and SE13 are also patterned by these photolithographic processes together with the stacked films FL1, FL2 and FL3. The organic layers OR1, OR2 and OR3, the upper electrodes UE1, UE2 and UE3 and the cap layers CP1, CP2 and CP3 are formed by vapor deposition. The sealing layers SE11, SE12 and SE13 are formed by chemical vapor deposition (CVD).

For example, the stacked film FL may be the stacked film which is formed firstly or lastly among the stacked films FL1, FL2 and FL3. The sealing layer SE1 may be the sealing layer which is formed firstly or lastly among the sealing layers SE11, SE12 and SE13.

In the example of FIG. 6, the end portion E2 of the stacked film FL and the end portion E3 of the sealing layer SE1 are located above the dam portion DM3. In addition, these end portions E2 and E3 are located on the partition 6C.

As shown in FIG. 7, each of the partitions 6C and 6D includes the lower and upper portions 61 and 62 similar to those of the partition 6A. The lower portion 61 of each of the partitions 6C and 6D includes the bottom layer 63 and the stem layer 64. In each of the partitions 6C and 6D, the upper portion 62 protrudes from the side surfaces of the stem layer 64. A similar configuration is applied to the partition 6B. Thus, the end portions of the partitions 6B, 6C and 6D have an overhang shape in a manner similar to that of the partition 6A shown in FIG. 3. In this manner, as shown in FIG. 6 and FIG. 7, the stacked film FL is divided near the end portions of the partitions 6B and 6C. The sealing layer SE1 continuously covers the portions into which the stacked film FL is divided.

The resin layer RS1, sealing layer SE2 and resin layer RS2 shown in FIG. 3 are provided above the sealing layer SE1. The resin layer RS1 covers the sealing layer SE1. When the display device DSP is manufactured, the dam portions DM1 and DM2 function to dam up the resin layer RS1 before it is cured.

In the example of FIG. 6, the end portion E4 of the resin layer RS1 is located between the display area DA and the partition 6C. More specifically, the end portion E4 is located above the dam portion DM2. It should be noted that the position of the end portion E4 is not limited to this example.

The sealing layer SE2 covers the end portion E4 of the resin layer RS1. The sealing layer SE2 is in contact with the sealing layer SE1 in an area located on an external side (the right side in the figure) relative to the end portion E4. In the example of FIG. 6, the end portion E5 of the sealing layer SE2 is located above the dam portion DM4. The sealing layer SE2 covers the end portion E2 of the stacked film FL, the end portion E3 of the sealing layer SE1, part of the partition 6C and part of the partition 6D.

When the display device DSP is manufactured, the dam portions DM3 and DM4 function to dam up the resin layer RS2 before it is cured. In the embodiment, the end portion E6 of the resin layer RS2 is located between the end portion E4 of the resin layer RS1 and the end portion E5 of the sealing layer SE2. More specifically, the end portion E6 is located above the dam portion DM4. The resin layer RS2 covers the sealing layer SE2 above the dam portion DM3. It should be noted that the position of the end portion E6 is not limited to this example. The resin layer RS2 covers the sealing layer SE2 above the dam portion DM3 and the partition 6C.

The stacked film FL formed by vapor deposition may have poor adherence for a base. Therefore, the stacked film FL and the sealing layer SE1 which covers the stacked film FL may be removed when the display device DSP is manufactured. This removal easily occurs on the upper surfaces of the dam portions DM1, DM2, DM3 and DM4.

In this regard, in the embodiment, the partition 6C is provided above the dam portion DM3. As the adherence between the stacked film FL and the partition 6C is relatively good, the removal of the stacked film FL can be prevented. In addition, since the end portion of the partition 6C has an overhang shape, the stacked film FL is divided at the time of vapor deposition. In this manner, the stacked film FL is divided into small pieces, thereby preventing the removal of the stacked film FL.

The stacked film FL (one of the stacked films FL1, FL2 and FL3) is formed in the entire substrate 10 before the stacked film FL is patterned. Thus, the stacked film FL is temporarily present above the dam portion DM4 as well. In this regard, in the embodiment, the partition 6D is provided above the dam portion DM4. This configuration can prevent the removal of the stacked film FL above the dam portion DM4 as well.

Further, in the embodiment, a wall for damming up the resin layer RS2 before cured is high compared to a case where the inorganic insulating layer 7, the partition 6C or the partition 6D is not provided above the dam portion DM3 or DM4. This configuration can prevent the resin layer RS2 from overflowing into the external side of the dam portions DM3 and DM4.

In the embodiment, the resin layer RS1 is surrounded by the sealing layers SE1 and SE2. By this configuration, the moisture intrusion into the resin layer RS1 is prevented. The end portion E4 of the resin layer RS1 is located above the dam portion DM2. In this case, if a partition is provided above the dam portion DM2, and a defect occurs in the shapes of the sealing layers SE1 and SE2 by this partition, the sealing of the resin layer RS1 could be incomplete.

However, in the embodiment, no partition is provided near the dam portion DM2. Thus, the sealing layers SE1 and SE2 can be satisfactorily formed. As a result, the moisture intrusion into the resin layer RS1 can be satisfactorily prevented.

Moreover, in the embodiment, the stacked film FL is divided in the end portions of the partitions 6B and 6C. This configuration can block the path of moisture intrusion through the stacked film FL.

In the embodiment, the partitions 6C and 6D are spaced apart from each other across the intervening gap G. If the partitions 6C and 6D are connected to each other, a floating conductive layer having a large area is provided in the surrounding area SA. In this case, an electrostatic discharge failure may occur because of the conductive layer. To the contrary, when the partitions 6C and 6D are spaced apart from each other as in the case of the embodiment, the occurrence of an electrostatic discharge failure can be prevented.

Thus, the embodiment can prevent the removal of the stacked film FL and improve the yield of the display device DSP. In addition, the reliability of the display device DSP can be improved by preventing the moisture intrusion into the inside of the display device DSP and an electrostatic discharge failure.

The configuration disclosed in the embodiment could be modified in various ways. Several modified examples are disclosed below.

Figure 8:
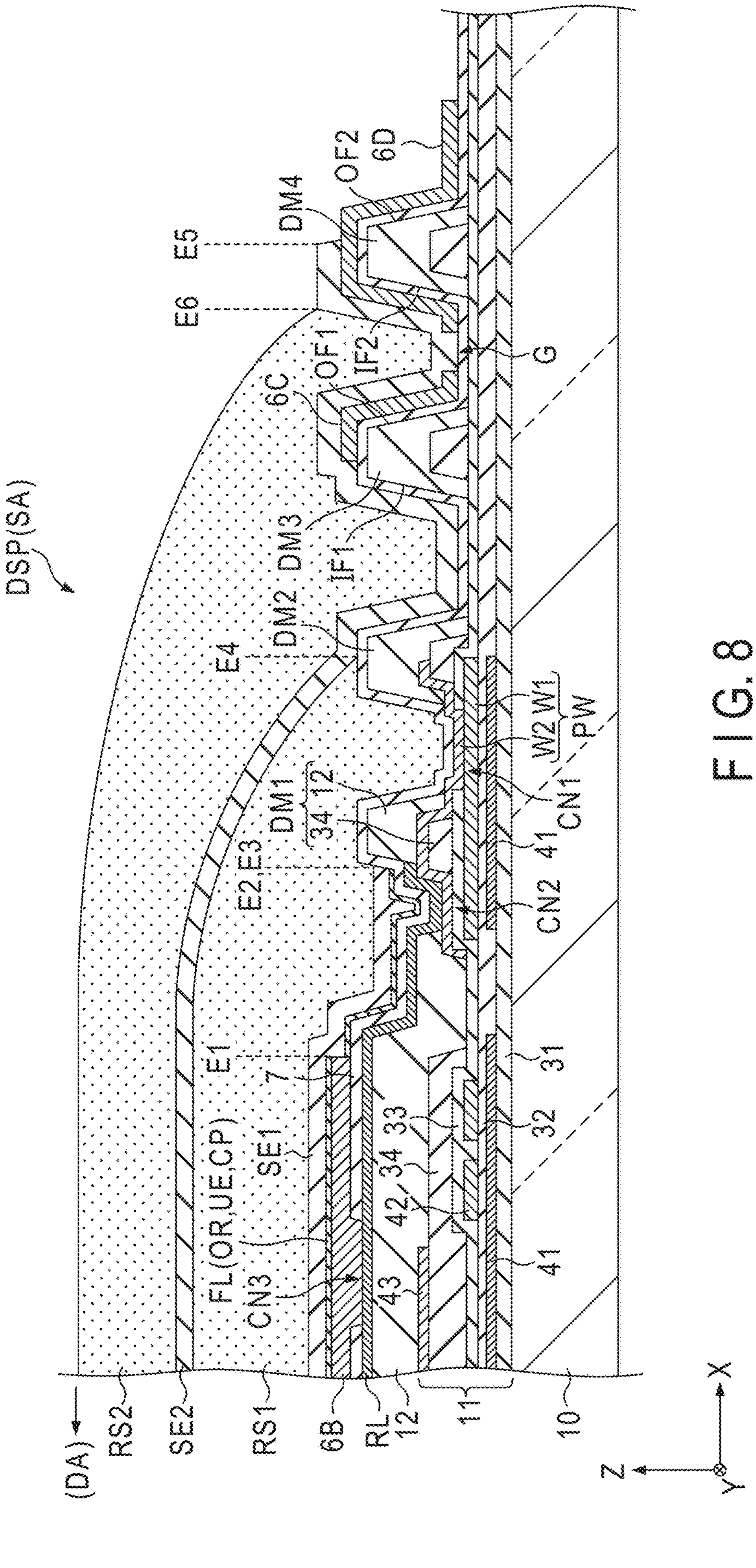
FIG. 8 is a schematic cross-sectional view of the display device according to a first modified example.

FIG. 8 is a schematic cross-sectional view of the display device DSP according to a first modified example. In the example of this figure, the end portion E1 of the partition 6B is located between the display area DA and the dam portion DM1. More specifically, the end portion E1 is located between the display area DA and the contact portion CN2.

In the example of FIG. 6, the end portion E1 is located between the dam portions DM1 and DM2. In this case, if the interval between the dam portions DM1 and DM2 is narrow, the shape of the resist provided at the time of patterning the inorganic insulating layer 7 could be defective. In other words, the lower side of the upper portion 62 is not easily filled with the resist in the end portion of the partition 6B. In the configuration of FIG. 8, the inorganic insulating layer 7 can be satisfactorily formed by preventing a defect in the shape of the above resist.

Further, in the example of FIG. 6, the end portion E2 of the stacked film FL and the end portion E3 of the sealing layer SE1 are located above the dam portion DM3. In this configuration, for example, in a case where the end portion E6 of the resin layer RS2 does not reach the dam portion DM4 and is dammed up by the dam portion DM3, and in addition, the sealing layer SE2 is formed only to the extent of the vicinity of the dam portion DM3, the end portion E2 may be exposed to the atmosphere. In this case, a path of moisture from the end portion E2 toward the display area DA side through the stacked film FL could be formed.

In this regard, in the example of FIG. 8, the end portions E2 and E3 are located between the display area DA and the partition 6C. More specifically, the end portions E2 and E3 are located between the display area DA and the end portion E4 of the resin layer RS1, and are covered with the resin layer RS1. In this configuration, the end portion E2 of the stacked film FL is not exposed from the resin layer RS2 regardless of the position of the end portion E6 of the resin layer RS2. In this manner, the reliability of the display device DSP can be improved by preventing moisture intrusion through the stacked film FL.

Figure 9:
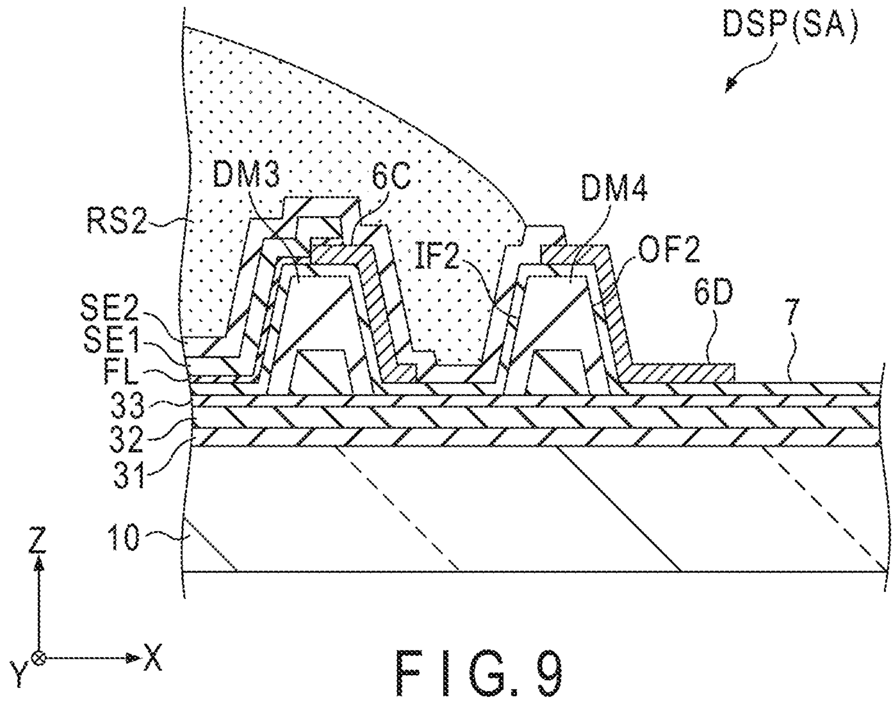
FIG. 9 is a schematic cross-sectional view of the display device according to a second modified example.

FIG. 9 is a schematic cross-sectional view of the display device DSP according to a second modified example. In the example of this figure, an end of the partition 6D is located above the dam portion DM4, and the other end is located on the external side (the right side in the figure) of the dam portion DM4. Thus, while the partition 6D faces the outer surface OF2 of the dam portion DM4 via the inorganic insulating layer 7, the partition 6D does not face the inner surface IF2.

Figure 10:
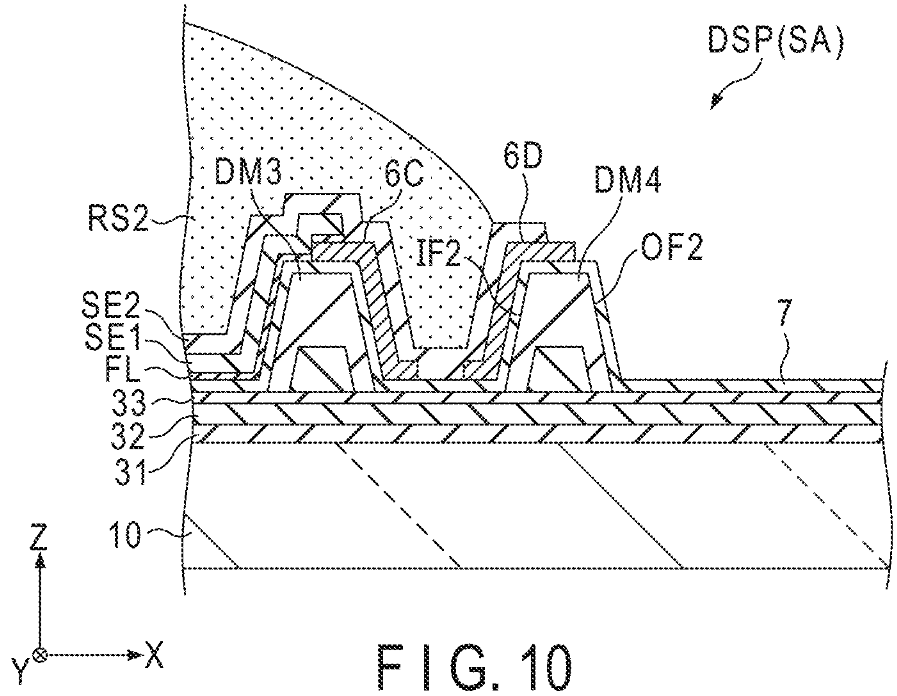
FIG. 10 is a schematic cross-sectional view of the display device according to a third modified example.

FIG. 10 is a schematic cross-sectional view of the display device DSP according to a third modified example. In the example of this figure, an end of the partition 6D is located between the dam portions DM3 and DM4, and the other end is located above the dam portion DM4. Thus, while the partition 6D faces the inner surface IF2 of the dam portion DM4 via the inorganic insulating layer 7, the partition 6D does not face the outer surface OF2. In this configuration, since the partition 6D is not provided on the external side (the right side in the figure) of the dam portion DM4, the area of the external side of the dam portion DM4 can be narrowed.

Figure 11:
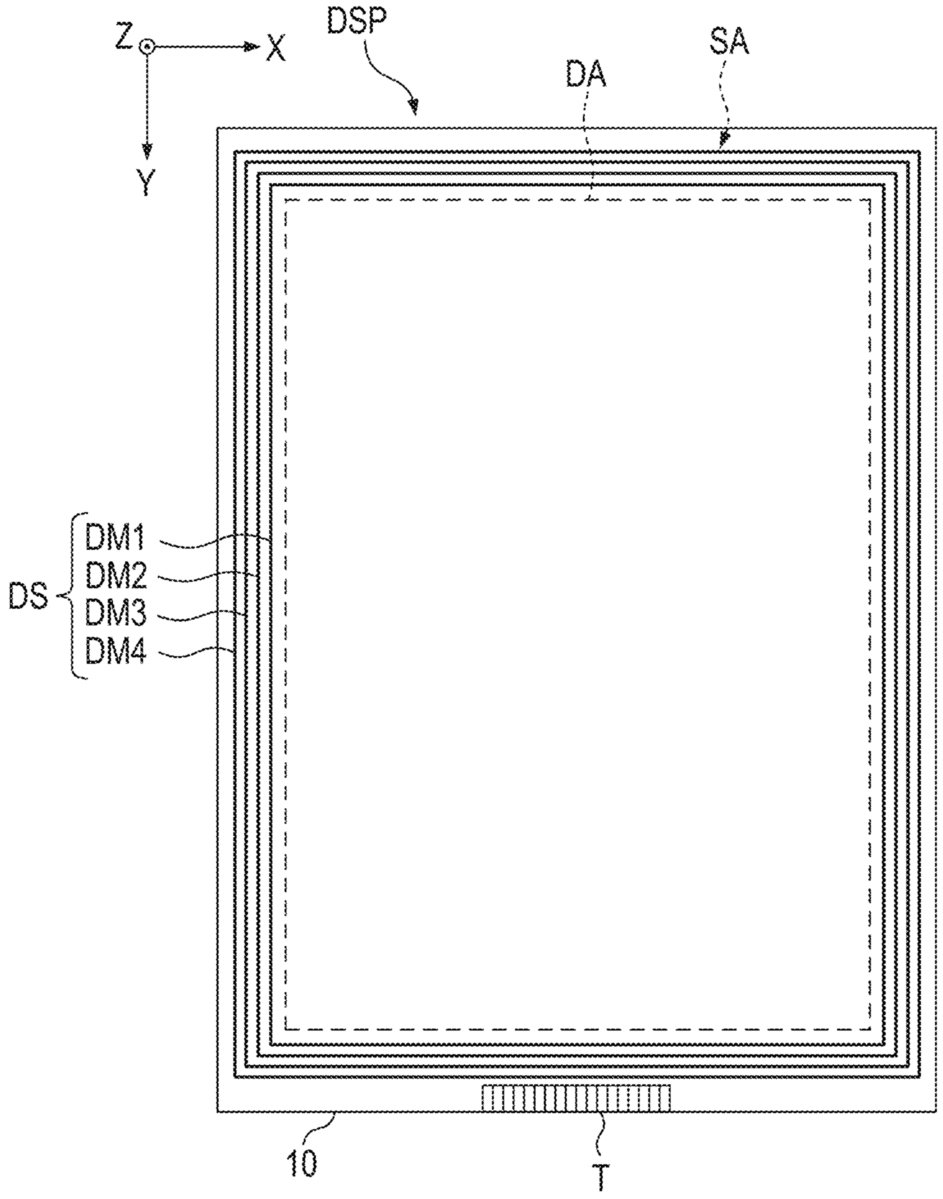
FIG. 11 is a schematic plan view of the display device according to a fourth modified example.

FIG. 11 is a schematic plan view of the display device DSP according to a fourth modified example. In the example of this figure, the substrate 10, the display area DA and the dam portions DM1, DM2, DM3 and DM4 are rectangular. Even in a case where the substrate 10 and the display area DA have a shape other than a circle in this manner, the configurations shown in FIG. 6 to FIG. 10 can be applied to the surrounding area SA.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:

a substrate having a display area which displays an image and a surrounding area around the display area;

a plurality of display elements each of which includes a lower electrode, an upper electrode located above the lower electrode and an organic layer located between the lower electrode and the upper electrode and emitting light based on application of voltage, and is provided in the display area;

a first partition provided in the display area and provided between the adjacent display elements;

a first dam portion which is provided in the surrounding area, protrudes to an upper side of the substrate and surrounds the display area; and a second partition which overlaps at least part of the first dam portion as seen in plan view, wherein each of the first partition and the second partition includes a conductive lower portion and an upper portion having an end portion protruding from a side surface of the lower portion.

2. The display device of claim 1, wherein the second partition surrounds the display area together with the first dam portion.

3. The display device of claim 1, wherein the first dam portion is formed of an organic insulating material.

4. The display device of claim 3, further comprising an inorganic insulating layer formed of an inorganic insulating material and located under the second partition, wherein the inorganic insulating layer covers the first dam portion.

5. The display device of claim 1, further comprising a first sealing layer which covers a stacked film including the organic layer and the upper electrode, wherein the stacked film and the first sealing layer are partly provided in the surrounding area.

6. The display device of claim 5, wherein end portions of the stacked film and the first sealing layer are located above the first dam portion.

7. The display device of claim 6, wherein the stacked film is divided by the second partition.

8. The display device of claim 5, further comprising a first resin layer which covers the first sealing layer, wherein an end portion of the first resin layer is located between the display area and the second partition.

9. The display device of claim 8, wherein end portions of the stacked film and the first sealing layer are located between the display area and the second partition and are covered with the first sealing layer.

10. The display device of claim 8, further comprising a second sealing layer which covers the first resin layer, wherein the second sealing layer is in contact with the first sealing layer in an area located on an external side relative to the end portion of the first resin layer.

11. The display device of claim 10, further comprising a second resin layer which covers the second sealing layer, wherein the second resin layer covers the second sealing layer above the first dam portion.

12. The display device of claim 1, further comprising:

a second dam portion which is provided in the surrounding area, protrudes to the upper side of the substrate and surrounds the display area; and a third partition which includes the lower portion and the upper portion and overlaps at least part of the second dam portion as seen in plan view.

13. The display device of claim 12, wherein the third partition surrounds the display area together with the second dam portion.

14. The display device of claim 12, wherein the second partition and the third partition are spaced apart from each other across an intervening gap.

15. The display device of claim 12, wherein the first dam portion has a first inner surface on a display area side, and a first outer surface on a side opposite to the first inner surface, and the second partition faces the first outer surface and does not face the first inner surface.

16. The display device of claim 12, wherein the second dam portion has a second inner surface on a display area side, and a second outer surface on a side opposite to the second inner surface, and the third partition faces both the second inner surface and the second outer surface.

17. The display device of claim 12, wherein the second dam portion has a second inner surface on a display area side, and a second outer surface on a side opposite to the second inner surface, and the third partition faces the second outer surface and does not face the second inner surface.

18. The display device of claim 12, wherein the second dam portion has a second inner surface on a display area side, and a second outer surface on a side opposite to the second inner surface, and the third partition faces the second inner surface and does not face the second outer surface.

19. The display device of claim 1, wherein the display area is circular, and each of the first dam portion and the second partition has an arcuate curved portion along the display area, and a linear portion which connects both end portions of the curved portion.

20. The display device of claim 19, further comprising a terminal portion provided in the surrounding area, wherein the linear portion is located between the display area and the terminal portion as seen in plan view.

* * * * *